United States Patent [19]

Collins et al.

[11] Patent Number: 4,666,557
[45] Date of Patent: May 19, 1987

[54] METHOD FOR FORMING CHANNEL STOPS IN VERTICAL SEMICONDUCTOR SURFACES

[75] Inventors: George J. Collins; Werner A. Metz, Jr., both of Fort Collins, Colo.

[73] Assignee: NCR Corporation, Dayton, Ohio

[21] Appl. No.: 680,034

[22] Filed: Dec. 10, 1984

[51] Int. Cl.$^4$ .................. H01L 21/225; H01L 21/302
[52] U.S. Cl. ..................... 156/643; 29/571; 29/580; 148/1.5; 148/187; 148/188; 156/657; 156/662; 204/192.37; 427/85; 427/87
[58] Field of Search ............... 156/643, 653, 657, 662, 156/663; 148/DIG. 93, DIG. 96, 1.5, 787, 188, DIG. 34, DIG. 90, DIG. 157; 204/192 E; 427/85, 86, 87; 29/571, 580, 578, 576 R

[56] References Cited

U.S. PATENT DOCUMENTS

| | | | |
|---|---|---|---|
| 4,209,350 | 6/1980 | Ho et al. | 148/1.5 X |
| 4,256,514 | 3/1981 | Pogge | 29/580 X |
| 4,313,773 | 2/1982 | Briska et al. | 156/663 X |
| 4,353,086 | 10/1982 | Jaccodine et al. | 29/571 X |
| 4,379,727 | 4/1983 | Hansen et al. | 148/187 X |
| 4,407,058 | 10/1983 | Fatula, Jr. et al. | 29/571 X |
| 4,419,810 | 12/1983 | Riseman | 29/571 |
| 4,466,178 | 8/1984 | Soclof | 148/1.5 X |
| 4,569,701 | 2/1986 | Oh | 148/188 |

FOREIGN PATENT DOCUMENTS

| | | | |
|---|---|---|---|
| 54-12791 | 5/1979 | Japan | 148/188 |
| 55-127016 | 10/1980 | Japan | 148/188 |

OTHER PUBLICATIONS

Whittle et al., "Control of Boron Diffusion from a Pyrolitic Borosilicate Glass Source", Journal Electrochemical Society, vol. 116, No. 5, May 1969, pp. 645-648.

Primary Examiner—Donald E. Czaja
Assistant Examiner—Ramon R. Hoch
Attorney, Agent, or Firm—Wilbert Hawk, Jr.; Casimer K. Salys

[57] ABSTRACT

A method for forming channel stops in the sidewalls of a trench isolation structure formed in a semiconductor substrate. In one form, anistrophically etched substrate trenches are conformally covered by doped glass, the doped glass is anisotropically etched to retain vertical, sidewall segments of doped glass, and the substrate is annealed to form shallow diffusions in the trench sidewalls. The depth of the sidewall diffusion is related to differences in the dopant segregation coefficients between the glass and substrate materials.

10 Claims, 8 Drawing Figures

METHOD FOR FORMING CHANNEL STOPS IN VERTICAL SEMICONDUCTOR SURFACES

BACKGROUND OF THE INVENTION

The present invention relates to channel stops and trench dielectric isolation structures for electrically isolating semiconductor devices and components in monolithic integrated circuits. The invention also relates to techniques for forming such channel stop structures alone or in combination with trench isolation structures. A layer of doped glass is formed on vertical sidewalls in the semiconductor substrate, then the dopant is driven into the substrate sidewall, taking advantage of the segregation of conductivity-altering impurities, such as boron, between the silicon and the glass to provide a narrow boron channel stop in the substrate sidewall.

Presently, VLSI integrated circuit structures are being scaled to ever smaller minimum feature sizes and separations to provide greater device densities and faster operational speeds. The minimum feature size and the minimum feature separation depend in part upon the minimum mask dimensions that are available for the particular lithographic process. These, in turn, depend upon various factors, including the lithographic process itself, the wafer topography, and the feature change associated with the particular process step (etching, implanting, diffusion).

It is highly desirable in integrated circuit (IC) processing to form channel stops having very small lateral dimensions which are consistent with the close packing necessary for VLSI and future device technologies. For the same reason, it is desirable to form trench isolation structures having very small lateral dimensions. FIG. 1 illustrates a desirable NMOS FET 11, which incorporates narrow channel stops 12 along the vertical semiconductor sidewalls of trench structures 13. The NMOS FET 11 is part of a CMOS (cmplementary MOS) structure and is formed in the p-well 14 of an n-type epitaxial layer 15. The FET 11 includes heavily doped source and drain regions 16 and 17 and LDD (lightly doped drain) regions 18, all of which are self-aligned with the conductively doped polysilicon gate 19. The FET IC structure also includes gate oxide sidewall spacers 21, interlevel dielectric 22, and aluminum interconnect 23. This is only one possible application of the illustrated channel stop channel stop-trench structure to various NMOS, PMOS, CMOS, bipolar and other integrated circuit structures.

Unfortunately, the dual constraints imposed by the lithographic process and the particular processing step are reflected in the unsuccessful attempts to form narrow channel stops using conventional technology. The prevalent techniques for forming channel stops involve the application of conventional lithographic masking and doping and thus are subject to the relatively large alignment tolerances associated with conventional lithographic masking, and variability in lateral diffusions of the channel stop regions during dopant drive cycle. For such reasons, conventional techniques are not suitable for forming the narrow channel stop structure shown in FIG. 1.

Predeposition and drive-in using a solid source are, of course, known, but to our knowledge are used in the art with conventional masking and/or drive-in techniques which are not amenable to forming thin diffusion regions on the vertical walls of trench isolation structures. For example, Briska et al U.S. Pat. No. 4,313,773 teaches predeposition and drive-in using an $SiB_6$ solid source. In particular, a layer of $SiB_6$ is selectively formed on an exposed silicon substrate using a conventional silicon dioxide deposition mask, and is followed with the deposition of a boron rich silicon dioxide layer and the deposition of a borosilicate glass layer. After boron is diffused into the silicon substrate with an anneal cycle, the outer layers are removed and the boron dopant is driven further into the underlying epi substrate by heating the substrate in an oxidizing ambient.

Ho et al, U.S. Pat. No. 4,209,350, forms channel stops using deposition and reactive ion etching, and avoids the use of a lithographic mask, per se, in defining the width of the channel stops. The horizontal/lateral width of the channel stop diffusion regions is defined by the corresponding dimension of an overlying, highly doped layer which is the source of the impurity dopant for the diffusion region. The Ho et al technique is illustrated in perhaps its broadest aspect by the formation of the channel stops 27 shown in FIG. 2. These channel stops are formed as follows. First, a diffusion barrier layer 28 of silicon dioxide or the like is formed on the semiconductor substrate 29. Reactive ion etching (RIE) is then applied to form openings 31 in the diffusion barrier layer 28. Thereafter, a doped insulator or polysilicon source layer is deposited on the diffusion barrier layer 28 and reactive ion etched to remove the horizontal portions of the layer and leave only the vertical sections 32 on the sidewalls of the diffusion barrier layer 28. The substrate channel stops 27 are then formed by vertical diffusion from the bottom of residual sections 32. The deposited thickness of dopant source layer 32 on the sidewalls of diffusion barrier layer 28 determines the width of the channel stops 27.

In short, Ho et al. uses the sidewalls of a first layer to locate a second doped layer for vertical diffusion into an underlying substrate. Diffusion barrier layer 28 blocks lateral diffusion from the layers 32 so that the diffusion is directed vertically downward into the substrate 29.

In another aspect, shown in FIG. 3, the Ho et al patent forms the first, locating layer 28 and the second, dopant source layer 32 in the channel region of an FET device between the substrate isolation trenches 33. During the drive-in of the n+ source and drain 35 and 36, opposite conductivity p-regions 37 are diffused from the dopant source layer 32 into the substrate to form a narrow channel at 38.

In other aspects, the Ho et al process is used to form collector and collector reach-through regions of bipolar devices. Here, again, the patent refers to the use of the sidewalls of a first, insulating layer to position a second, doped layer for vertical diffusion into an underlying substrate. The patent bypasses the use of a lithographic mask process in defining the width of the channel stops and, instead, uses the lateral thickness of this deposited vertical source layer for this purpose. However, the relatively narrow width channel stops as practiced in FIG. 3 are accomplished at the cost of using a selfaligned gate process.

Note that with the exception of very shallow channel stop dopant penetrations, the lateral diffusion during the vertical diffusion of the channel stops would seem to eliminate the original, relatively small lateral dimension of the channel stop.

In view of the above discussion, it is an object of the present invention to provide a channel stop fabrication process and structure which avoids the dual prior art constraints, i.e., photolithographic masking and vertical diffusion drive-in, on the minimum feature size of channel stops.

It is a corollary object of the present invention to provide a channel stop fabrication process which forms the channel stops along the vertically disposed walls of trench isolation structures and uses lateral drive-in of the dopant to define the channel stop.

SUMMARY OF THE INVENTION

In one aspect, the present invention involves forming shallow diffusion regions in vertically disposed surfaces of a semiconductor substrate, by forming a layer of doped dielectric material such as silicon dioxide on the surface topography of the substrate, including the vertical sidewall regions; etching the substrate to remove the horizontal sections of the dielectric layer while leaving intact the vertical sidewall sections; and heating the structure to drive dopant from the vertical sidewall layer sections into the substrate vertical sidewalls, whereby the segregation coefficient of the dopant in silicon and the dielectric, or selective heating of the glass, concentrates the impurity at the silicon-dielectric interface.

In another aspect, the process is applicable to forming combined channel stop-trench isolation structures by removing the doped dielectric layer, then filling in the etched regions with dielectric material.

In still additional aspects, well implant regions, such as those used for CMOS integrated circuits, may be formed between the trench structures prior to or subsequent to depositing and driving in the channel stop dopant.

During fabrication of the channel stop, the horizontal/lateral doping concentration and profile of the channel stop diffusions are controlled by the dopant impurity concentration of the dielectric layer, the sidewall thickness of the dielectric layer and the time/temperature product of the anneal as well as the above-mentioned segregation coefficients.

The above and other aspects of the present invention will be described in conjunction with the drawings in which:

FIG. 1 is a cross-section through a preferred integrated circuit structure having channel stops formed in the vertical sidewalls of trench isolation structures;

FIGS. 2 and 3 are schematic cross-sectional representations of a partially completed, integrated circuit illustrating prior art techniques for fabricating substrate diffusion regions/channel stops; and FIGS. 4 through 8 schematically represent cross-sections taken through an integrated circuit structure during the sequence of fabricating channel stops or combined channel stop-trench isolating structures in accordance with the present invention.

DETAILED DESCRIPTION

The present channel stopper process uses the relative segregation coefficients of boron in silicon and in silicon dioxide or other suitable dielectric to termally drive the boron into substrate trench sidewalls from borosilicate glass which is formed on the sidewalls. The process is completely compatible with the self-aligned gate technique. In addition, the approach eliminates the constraints of both lithographic mask formation and vertical diffusion which heretofore limited the minimum feature size of channel stopper regions. The channel stop formation process is readily and precisely controllable to provide the desired dimensions and concentration levels. In addition, in using sidewalls formed in a silicon semiconductor substrate, the channel stop process is ideally suited to integration with trench isolation fabrication techniques and to the formation of combined trench isolation and channel stop structures.

Figure 1:
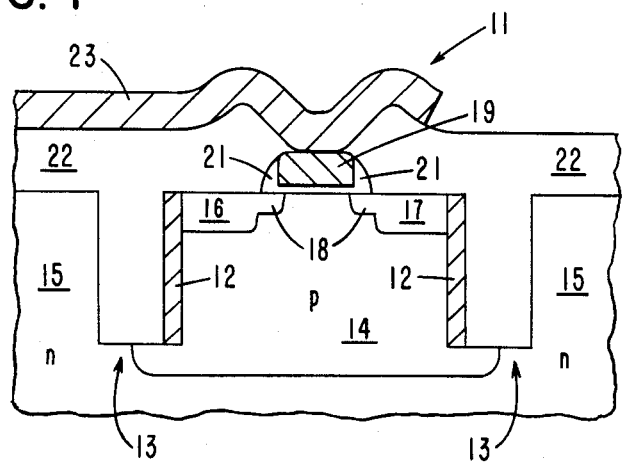
Figure 2:
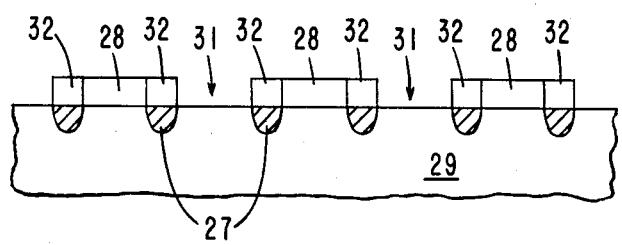
Figure 3:
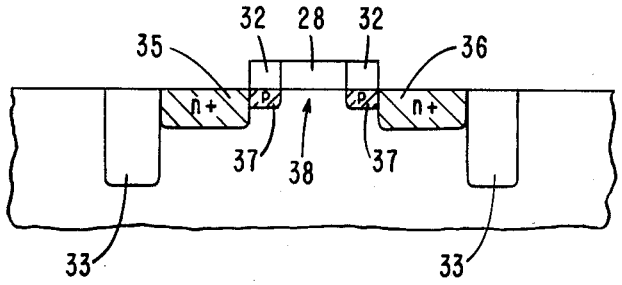
Figure 4:
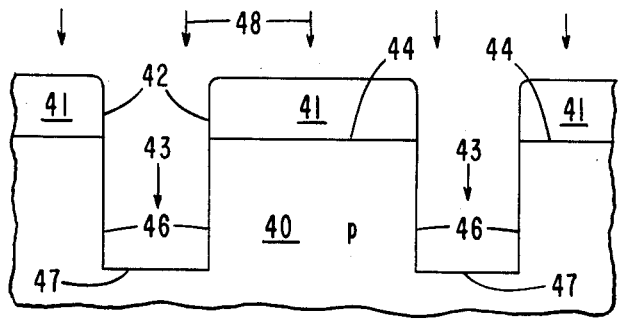

A typical starting structure for the fabrication of a combined channel stop-trench isolated structure is shown in FIG. 4 as a p$^-$ silicon substrate 40 having a resistivity of 1 to 20 ohm-centimeters. For a CMOS integrated circuit, the substrate could actually comprise a p-well formed within a n-epitaxial layer, as depicted in FIG. 1. The substrate 40 is masked using any of a number of materials including silicon nitride, silicon dioxide or combinations thereof, as well as by the exemplary photoresist mask 41. In addition, mask compositions suitable for X-ray or ion beam exposure can be used. Using photoresist, a layer thereof is formed on the substrate, then is exposed and developed to produce the etch mask 41 having openings 42 which correspond to the trench locations. It should be noted that the formation of the channel stops is not limited to formation in conjunction with trench isolation structures. Also, it should be noted that the dimensions of the drawings are chosen for convenience of representation and are not to scale.

Next, trenches 43 are etched to a typical depth of 1 to 6 microns, preferably using an anisotropic etch process such as plasma etching or reactive ion etching (RIE). This produces a substrate surface topology which includes the generally horizontal substrate outer surface 44, and the generally vertical sidewalls 46 and horizontal floor 47 of the trench. One preferred etch process is reactive ion etching using a fluorine etchant gas such as nitrogen trifluoride (NF$_3$). In such an anisotropic reactive ion etching process, the mechanical component or ion bombardment component 48 dominates the chemical reaction component and provides the vertical sidewalls which are desirable in order to provide minimal lateral width in the subsequently formed channel stops and trench isolation structures.

Figure 5:
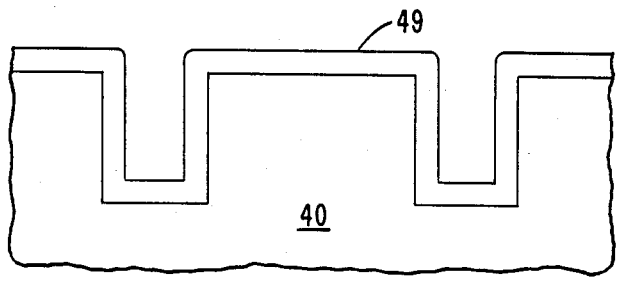

Referring now to FIG. 5, after the trench etching process, the mask 41 is removed such as by a plasma ashing process using, for example, an CHF$_3$ etchant gas. Next, a highly doped insulator layer 49 is formed on the substrate surface topography, including the trench sidewalls. Boron dopant is preferred for its segregation coefficient. However, phosphorus or arsenic can be used if selective heating such as by a 10.6 $\mu$ CO$_2$ laser is used to heat the doped insulator significantly more than the silicon. The layer 49 can be doped after its formation, for example by thermal oxidation in steam or by chemical vapor deposition. Preferably, however, the insulator layer 49 is doped during formation. In one embodiment, the doped dielectric layer 49 is borosilicate (or phosphosilicate or arsenic-doped) glass which is conformally deposited to a thickness of about 0.1 $\mu$ to 0.25 $\mu$ and contains about 0.5–8 percent by weight of impurities. The layer is formed using a low pressure, plasma assisted chemical vapor deposition reactor and using, e.g., the reactant gases SiH$_4$ and N$_2$O and BF$_3$ (or PH$_3$) as the dopant gas at a temperature of 380° C. and pressure of one Torr. Those skilled in the art will readily appreciate that a range of tempertures and pressures and, in fact, different processes can be used to form such a glass layer. The thickness and doping level of the layer 49 is chosen in conjunction with the time/- temperature product of the subsequent drive-in into the silicon substrate to control the concentration of the resulting channel stops.

Figure 6:
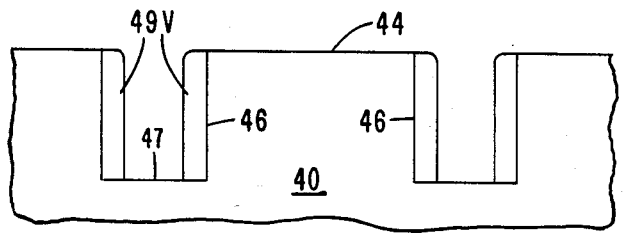

The next step is to again subject the surface topography to an anisotropic etch process, this time to remove those portions of the glass layer 49 which are formed on the horizontal surfaces 44 and 47, while retaining the vertical sections on the trench sidewalls, so as to create the structure shown in FIG. 6. One suitable etch process is reactive etching using $CHF_3$ etchant gas. As mentioned, in such an anisotropic reactive ion etch process, the ion bombardment component dominates the chemical reaction component and, in this case, removes the horizontal portions of the dielectric layer 49 without removing the vertical sidewall sections 49V. Those of usual skill in the art will have no difficulty in selecting other suitable reactive ion etching or plasma etching conditions to anisotropically etch the particular doped layer such as borosilicate glass. For example, anisotropic etching of an insulator layer is described in Pogge, U.S. Pat. No. 4,256,514. There, in pertinent part, trench structures are formed in a silicon substrate, and an insulator layer such as silicon oxide is formed on the resulting horizontal and vertical surfaces. The insulator layer is then etched to remove the layer from the floor of the trench, so that the sections of the layer on the vertical sidewalls of the trench define a narrow diffusion mask.

If substrate 40 as depicted in FIG. 6 included a well, such as p-well 14 in epi layer 15 as depicted in FIG. 1, the substrate would have to be photolithographically processed to mask the desired segments of trench sidewall oxide 49V while the exposed segments were removed with an isotrophic etch. Those of skill in the art will appreciate that doped oxide segments 49V should be retained by such masking only where the channel stop is to be created by the diffusion of a dopant opposite that previously characterizing the trench wall.

Figure 7:
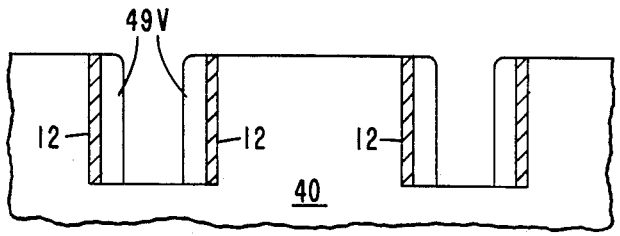

The next step in progression from FIG. 6 to FIG. 7 is to laterally drive-in the boron dopant from the trench sidewall oxide 49V into the silicon trench sidewalls 46. Rapid thermal annealing or furnace diffusion can be used to form channel stops 12 about 0.1–0.2 $\mu$ in depth. For an exemplary $10^{20}$ to $10^{21}$ atoms per $cm^3$ oxide doping level and 150 nanometer oxide thickness, a furnace annealing temperature of about 900° to 1100° C. in nitrogen ambient applied for about 2 to 5 hours provides channel stops 12 of approximately $10^{13}$ atoms per $cm^3$ concentration and 0.1 $\mu$ effective diffusion depth into the trench sidewall. The direction and magnitude of the diffusion is based on the segregation coefficient of boron in silicon vs. silicon dioxide. Alternatively, phosphorus doped (phosphosilicate) or arsenic doped glass 49 can be used. However, their segregation coefficients are such that phosphorus and arsenic tend to segregate to the silicon. Because of this, selective heating can be used to control the tendency to segregate to the silicon and provide very shallow, controllable doping. For example, a $CO_2$ laser operating at 10.6 micrometers will selectively heat the arsenic doped or phosphorus doped glass while the silicon remains relatively transparent to the laser and thus relatively cool. The hot glass adjacent the cooler silicon outdiffuses phosphorus or arsenic in a shallow, 0.1 $\mu$ wide diffusion 12 along the silicon trench sidewalls.

Figure 8:
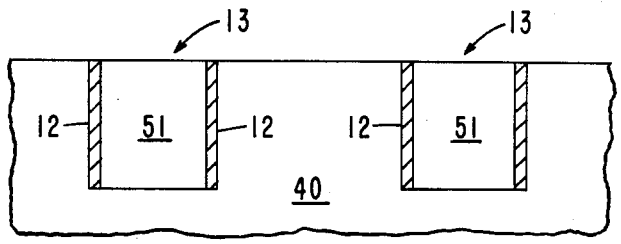

The trench structures 13 are completed as shown in FIG. 8 by forming dielectric layers 51 of silicon dioxide in the trenches. The oxide can be deposited by low pressure chemical vapor deposition using the reaction gases $SiH_4$ and $O_2$, a temperature of 450° C. and pressure of one Torr.

The above process is readily integrated into IC fabrication sequences. For example, the well implants used in CMOS structures can be formed either prior to or after the doping of the substrate sidewalls.

Those of usual skill in the art will appreciate that the channel stop thermal drive-in parameters may be altered to accommodate the subsequent thermal processing of the substrate in order to provide the desired final channel stop dimension and dopant profile in the completed IC structure. Those of ordinary skill in the art will also readily integrate the above-described channel stop structure and fabrication technique into other integrated circuit structures including NMOS, PMOS, CMOS and bipolar structures.

Having thus described preferred and alternative embodiments of the present invention, what is claimed is:

1. A process for forming diffusion regions of predetermined shallow depth in a semiconductor substrate comprising:
    etching selected substrate regions to provide horizontal surfaces and form substantially vertical sidewalls in the substrate;
    forming a layer of doped material on the etched substrate surface topology including the vertical sidewalls and horizontal surfaces;
    applying an anisotropic etch medium to the layer of doped material to remove the layer from the horizontal surfaces of the substrate while leaving the vertical sidewall sections of the doped material layer intact;
    and following the anistropic etch removal of the doped material layer from the horizontal surfaces heating the structure to effectuate a diffusion of dopant from the retained sidewall sections of doped material into the vertical sidewalls of the substrate because of differences in the segregation coefficients of the substrate and doped materials.

2. The process of claim 1 wherein the heating step comprises a selective heating of the doped material.

3. The process of claim 1 wherein the heating step comprises a selective heating of the doped material using a laser of wavelength of about 10.6 micrometers.

4. The process of claims 2 or 3 wherein the doping profile of the resulting diffused substrate regions are controlled by the impurity concentration of the doped material, the thickness of the doped material sidewall layer, and the time/temperature product of the heating step.

5. The process of claim 1, further comprising, after the drive-in step, forming a dielectric material in the regions where the substrate was etched.

6. The process of claim 4, wherein the doped material is a heavily doped dielectric.

7. A process for forming channel stop diffusion regions in a semiconductor substrate, comprising:
    anisotropically etching the substrate to form trenches therein having substantially vertical sidewalls;
    depositing, on the resulting etched substrate surface topology including the vertical sidewalls, a layer of doped glass;
    applying an anisotropic etch medium to the layer of doped glass to remove glass from the horizontal surfaces of the substrate surfaces while leaving the vertical trench sidewall sections of the layer;

following the etch removal of the doped glass from the horizontal surfaces heating the structure to drive the dopant in the glass layer on the vertical trench sidewalls into the adjacent substrate sidewalls using the segration coefficients of the dopant in glass and in semiconductor material; and filling the trench with dielectric material.

8. The process of claim 7, wherein the heating step uses rapid thermal annealing techniques to drive the opant into the substrate trench sidewalls and thereby form channel stops about 0.1 to 0.2 micrometers in depth.

9. The process of claim 7, wherein the heating step uses a non-oxidizing ambient at a temperature of 900° to 1100° C. for a period of 2 to 5 hours to drive the dopant into the substrate trench sidewalls and thereby form channel stops about 0.1 micrometers in depth.

10. The process of claim 7 wherein the heating step uses a laser of approximately 10.6 micrometer wavelength to drive the dopant into the substrate trench sidewalls and thereby form channel stops about 0.1 to 0.2 μ in depth.

* * * * *